United States Patent [19]
Brown et al.

[11] Patent Number: 6,097,069
[45] Date of Patent: Aug. 1, 2000

[54] METHOD AND STRUCTURE FOR INCREASING THE THRESHOLD VOLTAGE OF A CORNER DEVICE

[75] Inventors: Jeffrey S. Brown, Middlesex; Robert J. Gauthier, Hinesburg; Steven H. Voldman, South Burlington, all of Vt.

[73] Assignee: International Business Machines Corporation, Armonk, N.Y.

[21] Appl. No.: 09/102,196

[22] Filed: Jun. 22, 1998

[51] Int. Cl.[7] .............................. H01L 29/76; H01L 29/00
[52] U.S. Cl. .......................... 257/374; 257/510; 257/506; 257/411
[58] Field of Search ...................................... 257/510, 356, 257/405, 410, 411, 506, 395, 355, 374

[56] References Cited

U.S. PATENT DOCUMENTS

| | | |
|---|---|---|
| 4,481,527 | 11/1984 | Chen et al. . |
| 4,698,900 | 10/1987 | Esquivel . |
| 4,923,821 | 5/1990 | Namose . |
| 5,399,520 | 3/1995 | Jang . |
| 5,457,339 | 10/1995 | Komori et al. . |
| 5,468,677 | 11/1995 | Jun . |
| 5,521,422 | 5/1996 | Mandelman et al. . |
| 5,539,229 | 7/1996 | Noble, Jr. et al. . |
| 5,606,202 | 2/1997 | Bronner et al. . |
| 5,646,052 | 7/1997 | Lee . |
| 5,646,063 | 7/1997 | Mehta et al. . |
| 5,650,654 | 7/1997 | Noble . |
| 5,674,775 | 10/1997 | Ho et al. . |

*Primary Examiner*—Tom Thomas
*Assistant Examiner*—Thien F Tran
*Attorney, Agent, or Firm*—Scully, Scott, Murphy & Presser; Eugene I. Shkurko, Esq.

[57] ABSTRACT

A structure for increasing the threshold voltage of a corner device, particularly for shallow trench isolation having narrow devices. An FET comprises a substrate having a channel formed therein under a gate between spaced source and drain regions. A trench isolation region is formed in the substrate around the transistor and on opposite sides of the channel to isolate the transistor from other devices formed in the substrate, with the trench isolation region forming first and second junction corner devices with opposite sides of the channel. A first dielectric layer is formed under the gate and over the channel of the field effect transistor to form a gate insulator for the transistor. A second corner edge dielectric layer is formed under the gate structure and over the first and second corner devices, such that the corner edge dielectric layer increases the thickness of dielectric over each corner device and thus increases the threshold voltage (Vt) and edge dielectric breakdown and decreases MOSFET corner gate-induced drain leakage.

9 Claims, 4 Drawing Sheets

MOSFET with Corner Device Effect

MOSFET with no Corner Device Effect

METHOD AND STRUCTURE FOR INCREASING THE THRESHOLD VOLTAGE OF A CORNER DEVICE

DESCRIPTION

Technical Field

The present invention relates generally to a method and structure for increasing the threshold voltage of a corner device, and more particularly pertains to a method and structure for increasing the threshold voltage of a corner device, provided in a controllable process for solving corner parasitic current conduction at Shallow Trench Isolation (STI), particularly STI having narrow devices.

SUMMARY OF THE INVENTION

Accordingly, it is a primary object of the present invention to provide a method and structure increasing the threshold voltage of a corner device.

A further object of the subject invention is the provision of a more controllable process for solving corner parasitic current conduction at Shallow Trench Isolation (STI), particularly STI having narrow devices.

A further object of the subject invention is to provide a method and structure for increasing the breakdown voltage of the dielectric at the corner device.

A further object of the subject invention is to provide a method and structure to reduce the (3-D) three dimensional MOSFET gate-induced drain leakage mechanism of the corner device.

As the widths of todays advanced Complementary Metal Oxide Semiconductor (CMOS) devices are being scaled down, the "corner device" becomes a bigger problem. This problem can be solved or reduced in various ways, for example by reducing Shallow Trench Isolation (STI) pulldown, increasing the corner rounding at the edges of the STI, or living with the STI pulldown but increasing the oxide thickness over this region such that the threshold voltage of the corner device is increased greater than the FET's threshold voltage.

The present invention concerns the later approach, living with the STI pulldown and increasing the oxide thickness over the STI pulldown region to increase the threshold voltage of the corner device. With dual oxide processes becoming more common and even mandatory in contemporary advanced CMOS technologies, the second oxide coating can be used to increase the threshold voltage of the corner device.

The present invention provides the following advantages:

1. provides a simple method, no additional masks are required to reduce corner device effects;
2. provides a reduction in off-current due to the corner device;
3. provides an increase in the edge dielectric breakdown voltage;
4. provides a reduction in MOSFET gate-induced drain leakage at the corner; and
5. makes modeling of an FET simpler since the corner device kink in I-V curve is delayed due to the increased threshold voltage of the corner device.

The present invention provides a thick oxide shape around the edges of RX, and utilizes an existing dual-oxide process.

In accordance with the teachings herein, the present invention provides a field effect transistor which comprises a substrate having first and second doped regions which form respectively the source and drain regions. A gate is formed between the source and drain regions to define a channel therebetween. A trench isolation region is formed in the substrate around the transistor to isolate it from other devices formed in the substrate, with the trench isolation region forming first and second junction corner devices with first and second sides of the channel. A first dielectric layer is formed under the gate and over the channel of the field effect transistor to form a gate insulator for the transistor. A second corner edge dielectric layer is formed under the gate and over the first and second corner devices, such that the corner edge dielectric layer increases the thickness of dielectric over each corner device and thus increases the threshold voltage (Vt) and edge dielectric breakdown voltage, and decreases MOSFET corner gate-induced drain leakage.

In greater detail, the substrate source and drain regions and the isolation region include coplanar top surfaces, and the second corner edge dielectric layer is formed over a portion of the coplanar top surface of the channel and also over a portion of the coplanar top surface of the trench isolation region. The second corner edge dielectric layer is preferably in the shape of first and second stripes overlapping both sides of each corner device. The second dielectric layer also includes substantially vertical sidewalls terminating over the channel.

In a first embodiment, the first dielectric layer is formed directly over the channel, and the second corner edge dielectric layer is formed directly over the first dielectric layer over the first and second corner devices.

In a second embodiment, the second corner edge dielectric layer is formed directly over the first and second corner devices, and the first dielectric layer is formed directly over the second corner edge dielectric layer and also over the channel.

The first and second dielectric layers preferably comprise dielectric oxides, and the first and second dielectric layers are deposited by a dual oxide process. In such a process, the formation of the second dielectric layer does not require the use of an additional mask step, but is performed as an integral part of the dual oxide process performed on the field effect transistor. The transistor is preferably fabricated in CMOS.

BRIEF DESCRIPTION OF THE DRAWINGS

The foregoing objects and advantages of the present invention for a method and structure of increasing a corner device's threshold voltage and breakdown voltage may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
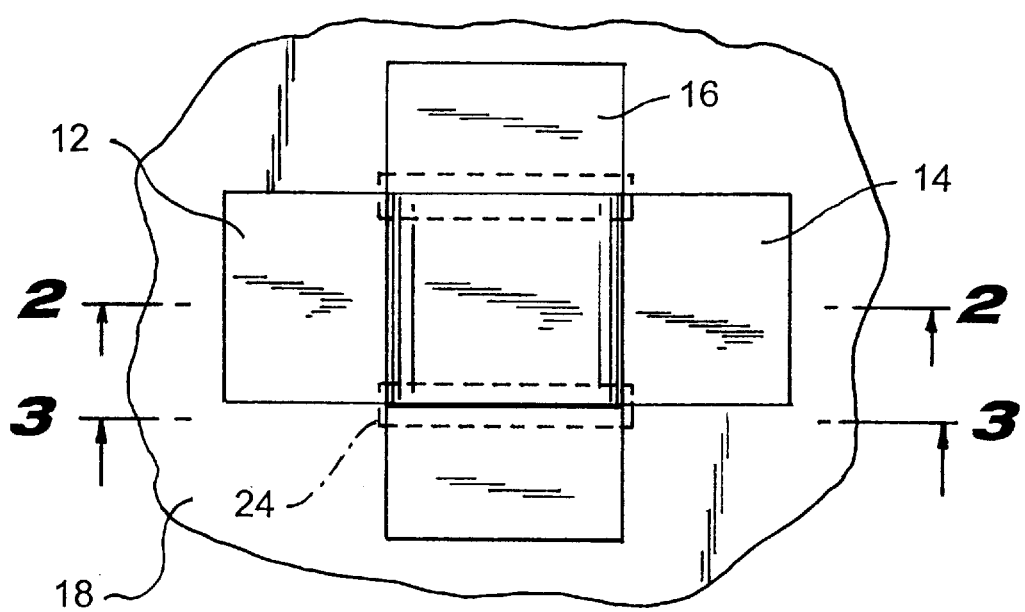
FIG. 1 illustrates a top plan view of typical CMOS structure for a field effect transistor (FET) in a silicon substrate which illustrates how the corner device or effect comes into existence, and also illustrates the solution provided by the present invention.
Figure 2:
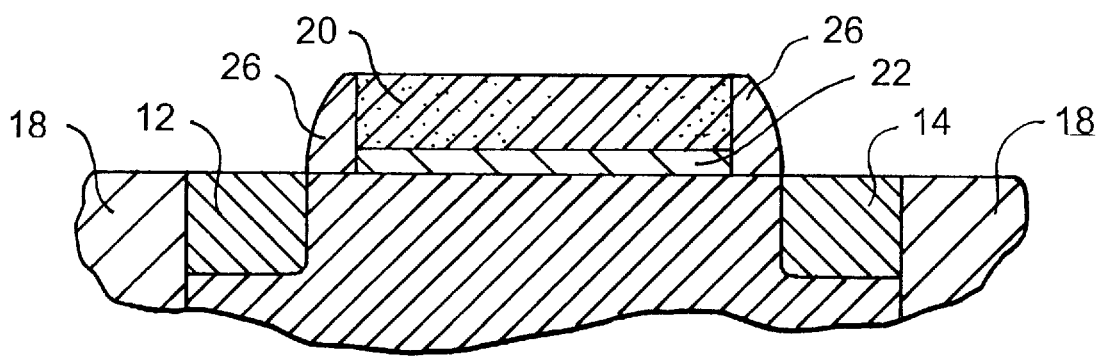
FIG. 2 is a sectional view, taken in the direction of arrows 2—2 in FIG. 1, through the center of the channel of FIG. 1.
Figure 3:
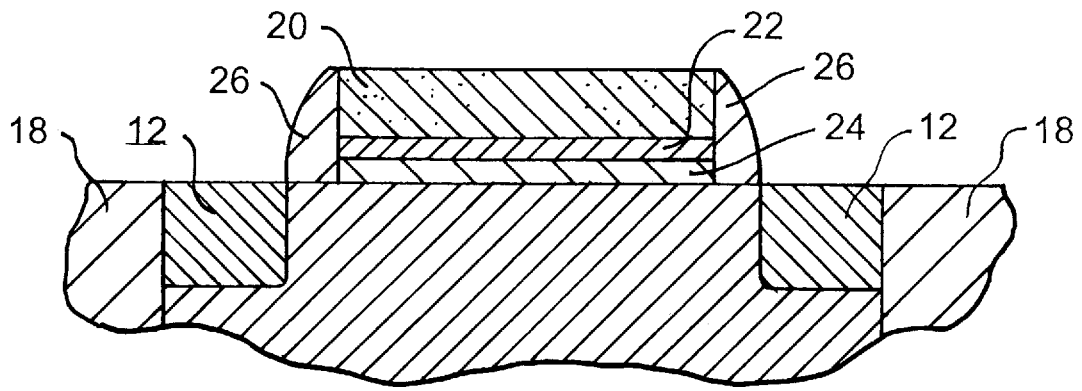
FIG. 3 is a sectional view, taken in the direction of arrows 3—3 in FIG. 1, along the edge of the channel of FIG. 1.
Figure 4:
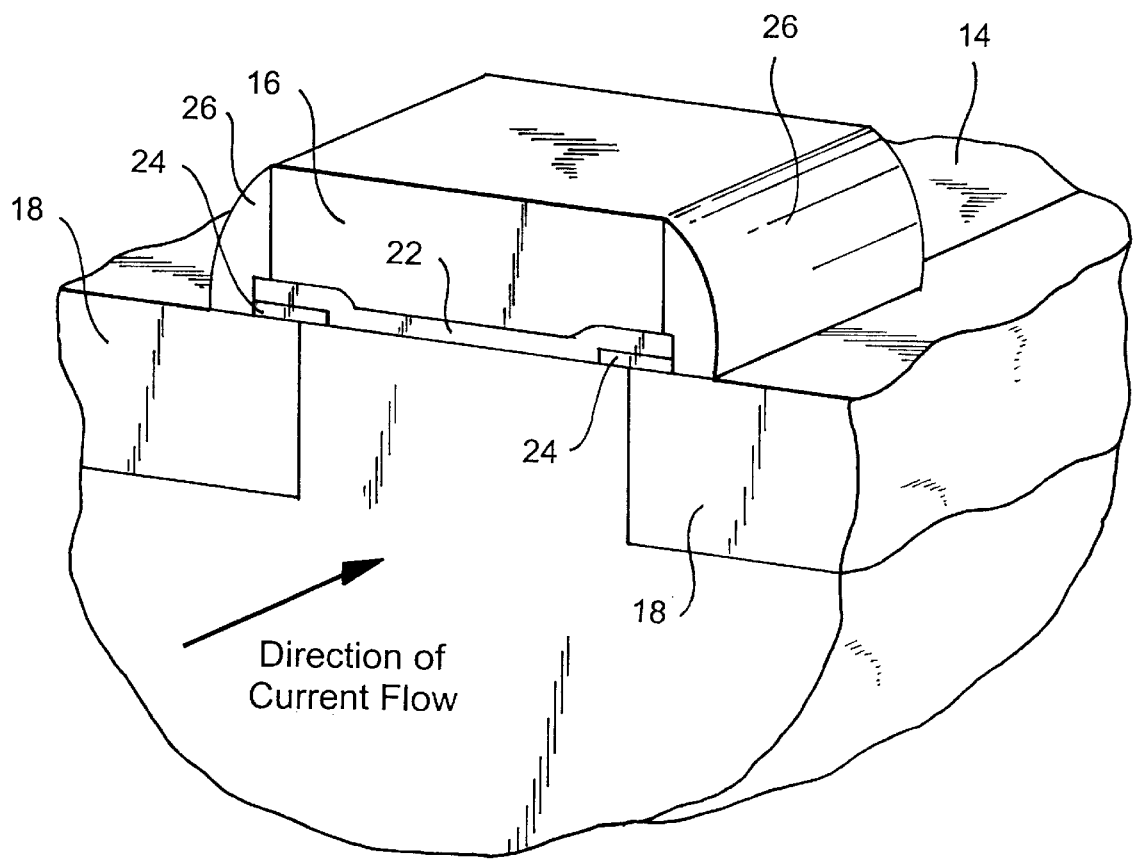
FIG. 4 is a front top perspective view of the CMOS structure for a field effect transistor (FET) in a silicon substrate, of FIGS. 1–3, which illustrates more graphically the CMOS FET structure.

Referring to the drawings in detail, FIGS. 1–4 illustrate a typical CMOS structure for a field effect transistor (FET) in a silicon substrate which illustrates how the corner device or effect comes into existence, and also illustrates the solution provided by the present invention. FIG. 1 is a top plan view of the CMOS structure, while FIG. 2 is a sectional view, taken in the direction of arrows 2—2 in FIG. 1, through the center of the channel of FIG. 1. FIG. 3 is a sectional view, taken in the direction of arrows 3—3 in FIG. 1, along the edge of the channel of FIG. 1, and FIG. 4 is a front top perspective view which illustrates more graphically the CMOS FET structure.

A substrate is appropriately doped to define source 12 and drain regions 14, and a polysilicon gate structure 16 forms a channel between the source 12 and drain regions 14 to form an FET. The drawings illustrate typical dopings for an NMOSFET, but the present invention is also applicable to PMOSFET devices and other dopings. A Shallow Trench Isolation (STI) region 18 is formed in the substrate around the FET to isolate the FET from other similar devices formed in the substrate. The gate structure is defined by a conductive polysilicon gate conductor 20 over a dielectric layer 22 which separates and insulates the poly gate conductor from the substrate therebeneath.

Pursuant to the teachings of the present invention, a thick corner edge oxide stripe 24 is placed over the corner device over and around the vertical junction between the surrounding STI 18 and the source 12/drain 14, and extends along that junction underneath the gate channel, as illustrated in FIGS. 1 and 3. A MOSFET spacer 26 is deposited along the side of the gate to form part of the gate structure as illustrated in FIGS. 2 and 3, as is conventional in this art.

The corner edge oxide 24 increases the oxide thickness over the corner device, and thus increases the threshold voltage (Vt) thereof. The corner oxide stripe 24, which is called an LP mask as used in NVRAM processes, provides a thick oxide coating over the corner device as illustrated in FIGS. 1 and 3. In dual oxide processes, this oxide coating 24 does not require the use of any additional mask steps, but can be performed as an integral part of the dual oxide process.

Figure 5:
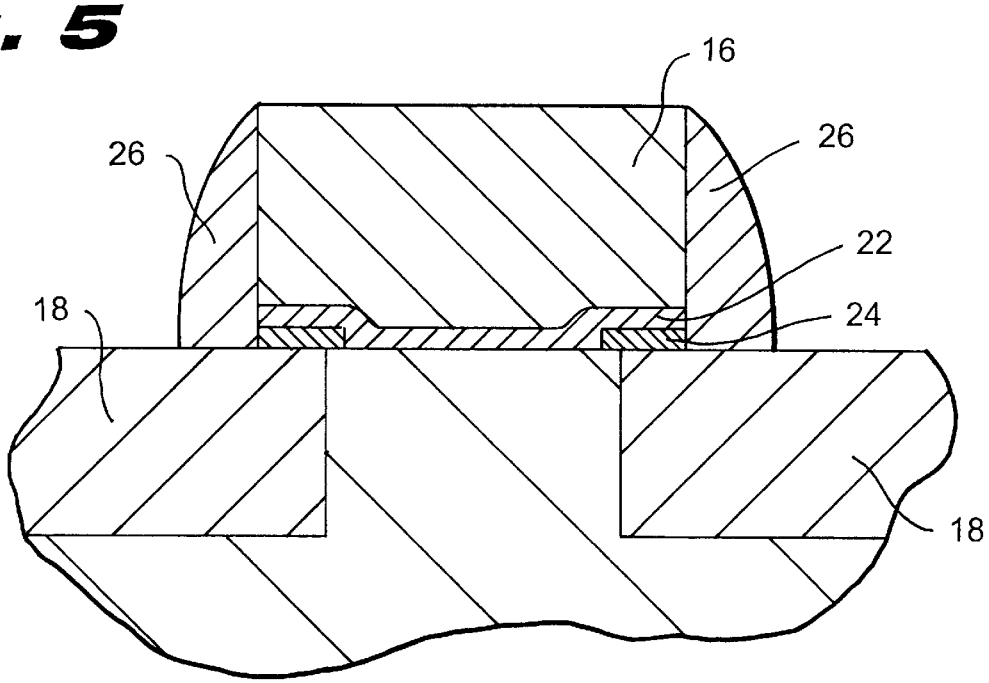
FIG. 5 illustrates a cross sectional view of a corner device wherein the dual oxide process is used to increase the threshold voltage of the corner device, and wherein the first oxide coating is used as the RX shape and the second oxide coating is the actual gate oxide of the FET.
Figure 6:
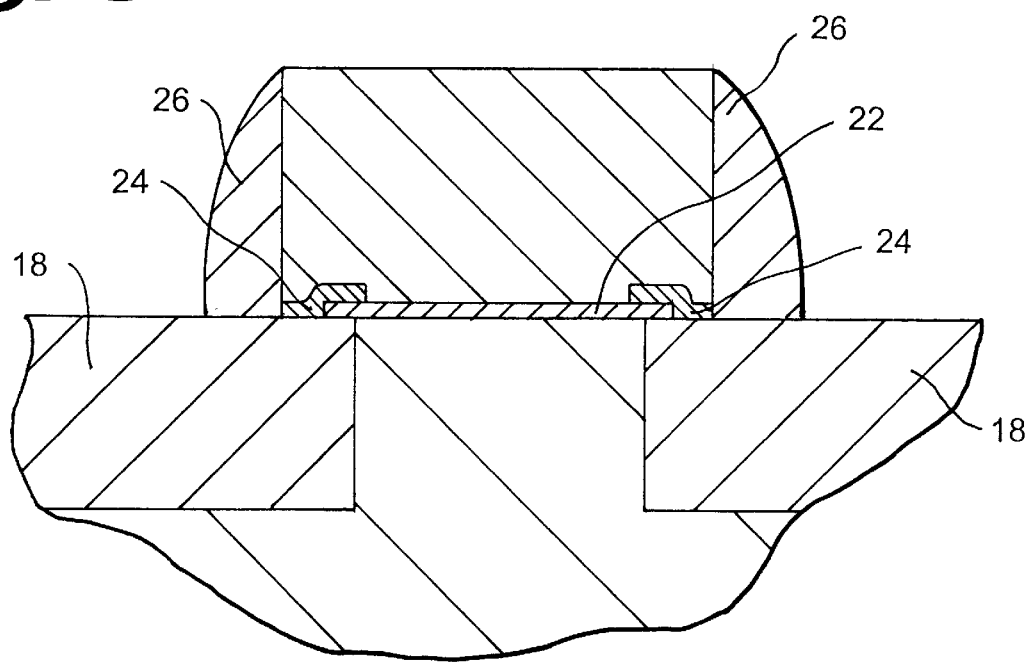
FIG. 6 illustrates a cross sectional view of a corner device wherein the dual oxide process is used to increase the threshold voltage of the corner device, and wherein the first oxide coating is the actual gate oxide of the FET, and the second oxide coating is used as the RX shape.

FIGS. 5 and 6 illustrate cross sectional views of first and second embodiments of corner devices wherein the dual oxide process is used to increase the threshold voltage of the corner device. In the cross section illustrated in FIG. 5, the first oxide coating is used as the RX ring and the second oxide coating is the actual gate or channel oxide of the FET. In the cross section illustrated in FIG. 6, the first oxide coating is the actual gate oxide of the FET, and the second oxide coating is used as the RX ring.

Figure 7:
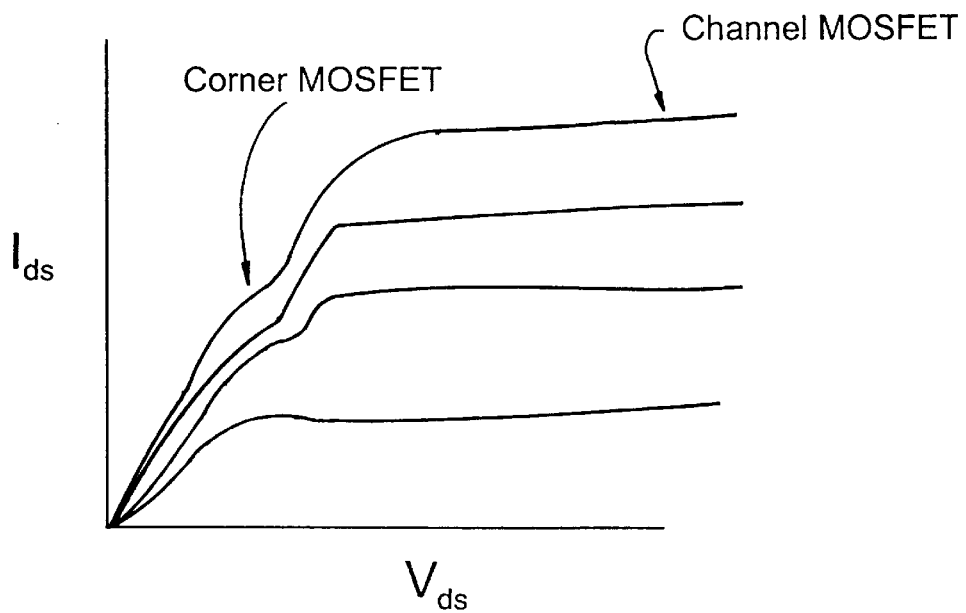
FIGS. 7 and 8 are graphs which illustrate respectively the Ids - Vds characteristics of a MOSFET with a corner device effect (represents the prior art) and a MOSFET with no corner device effect (represents the present invention).
Figure 8:
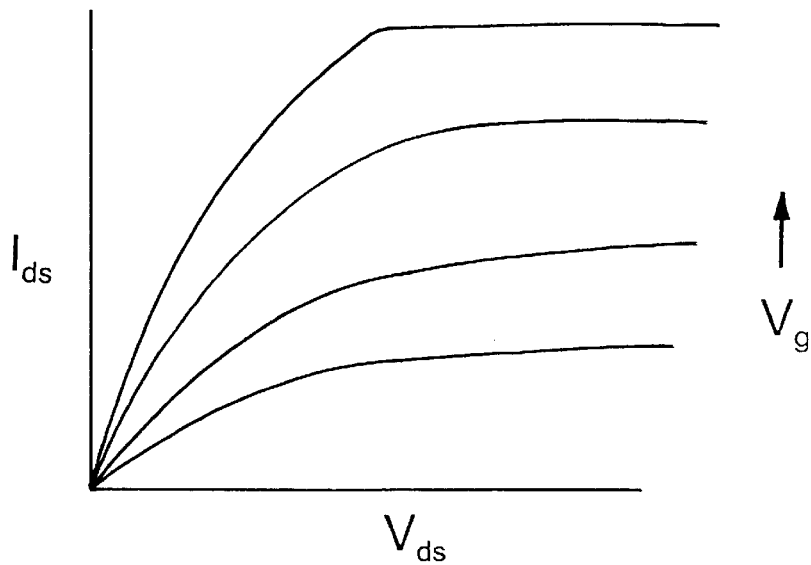

FIGS. 7 and 8 are graphs which illustrate respectively the Ids - Vds characteristics of a MOSFET with a corner device effect (represents the prior art) and a MOSFET with no corner device effect (represents the present invention). The deleterious effects of the corner device effect can be clearly seen in the unevenness of the curves of FIG. 7.

While several embodiments and variations of the present invention for a method and structure for increasing the threshold voltage and breakdown voltage of a corner device are described in detail herein, it should be apparent that the disclosure and teachings of the present invention will suggest alternative designs to those skilled in the art.

Having thus described our invention, what we claim as new, and desire to secure by Letter Patent is:

1. A field effect transistor comprising:
   a. a substrate having a first doped region forming a source and a second doped region forming a drain, and a gate structure forming a channel between the source and drain regions to form the field effect transistor;
   b. a trench isolation region formed in the substrate around the transistor to isolate the transistor from other devices formed in the substrate, with the trench isolation region forming first and second junction corner devices with the channel;
   c. a first dielectric layer formed under the gate structure to form a gate insulator for the field effect transistor;
   d. a second corner edge dielectric layer formed under the gate structure and over the first and second corner devices such that the corner edge dielectric layer increases the thickness of dielectric over each corner device, and thus increases the threshold voltage (Vt) and edge breakdown voltage and decreases corner gate-induced drain leakage.

2. The field effect transistor of claim 1, wherein the channel and the isolation region include coplanar top surfaces, and the second corner edge dielectric layer is formed over the first and second corner devices over a portion of the coplanar top surface of the channel and also over a portion of the coplanar top surface of the trench isolation region.

3. The field effect transistor of claim 1, wherein the second dielectric layer includes substantially vertical sidewalls terminating over the channel.

4. The field effect transistor of claim 1, wherein the first dielectric layer is formed directly over the channel, and the second corner edge dielectric layer is formed directly over the first dielectric layer over the first and second corner devices.

5. The field effect transistor of claim 1, wherein the second corner edge dielectric layer is formed directly over the first and second corner devices, and the first dielectric layer is formed directly over the second corner edge dielectric layer and also over the channel.

6. The field effect transistor of claim 1, wherein the second corner edge dielectric layer is in the shape of first and second stripes overlapping both sides of each corner device.

7. The field effect transistor of claim 1, wherein the first and second dielectric layers comprise dielectric oxides.

8. The field effect transistor of claim 7, wherein the first and second dielectric layers are deposited by a dual oxide process, wherein the formation of the second dielectric layer does not require the use of an additional mask step but is performed as an integral part of the dual oxide process performed on the field effect transistor.

9. The field effect transistor of claim 1, wherein the transistor is fabricated in CMOS.

* * * * *